(12) United States Patent
Kock et al.

(10) Patent No.: US 6,985,993 B2
(45) Date of Patent: Jan. 10, 2006

(54) CONTROL REGISTER ASSEMBLY

(75) Inventors: Ernst Josef Kock, Kirchseeon (DE);
Peter Rohm, Pfaffenhofen (DE);
Berthold Tillmann, Moosinning (DE)

(73) Assignee: Infineon Technologies AG, Munich (DE)

( * ) Notice: Subject to any disclaimer, the term of this patent is extended or adjusted under 35 U.S.C. 154(b) by 437 days.

(21) Appl. No.: 10/233,700

(22) Filed: Sep. 3, 2002

(65) Prior Publication Data

US 2003/0056044 A1    Mar. 20, 2003

(30) Foreign Application Priority Data

Aug. 31, 2001    (DE)    ................... 101 42 675

(51) Int. Cl.
*G11C 19/00* (2006.01)
*G06F 13/00* (2006.01)

(52) U.S. Cl. ............................. 711/109; 377/54; 377/64
(58) Field of Classification Search .................. 365/75, 365/78, 189.12; 377/54, 64, 67; 711/109, 711/110
See application file for complete search history.

(56) References Cited

U.S. PATENT DOCUMENTS

| | | | | |
|---|---|---|---|---|
| 3,581,296 A | * | 5/1971 | Brooks | ........................ 365/90 |
| 4,641,276 A | | 2/1987 | Dunki-Jacobs | ................ 710/71 |
| 4,677,650 A | * | 6/1987 | Boudewijns et al. | ......... 377/63 |
| 4,843,539 A | | 6/1989 | Bury | ............................ 714/43 |
| 5,600,671 A | | 2/1997 | Maul et al. | .................. 375/211 |
| 5,696,928 A | * | 12/1997 | Grewe et al. | ................ 711/103 |
| 5,889,504 A | * | 3/1999 | Kihara et al. | ................ 345/100 |

FOREIGN PATENT DOCUMENTS

| | | |
|---|---|---|
| DE | 31 39 421 C2 | 4/1983 |
| DE | 36 03 751 A1 | 8/1987 |
| DE | 41 00 629 C1 | 8/1992 |
| DE | 92 19 070 U1 | 8/1997 |
| DE | 691 28 521 T2 | 4/1998 |
| DE | 197 32 842 C2 | 2/1999 |
| EP | 0 235 559 A1 | 9/1987 |
| EP | 0 490 511 A2 | 6/1992 |
| EP | 0 588 715 A1 | 3/1994 |

\* cited by examiner

*Primary Examiner*—Gary Portka
(74) *Attorney, Agent, or Firm*—Laurence A. Greenberg; Werner H. Stemer; Ralph E. Locher

(57) ABSTRACT

A control register assembly controls components to be controlled in an electric circuit. The control register assembly includes a control register. The control register is formed by at least one shift register, whose elements are distributed over the electric circuit at mutual intervals, individually or in groups. Such a control register makes it possible to keep short the length of the connecting lines between the control register and the device writing the latter and between the control register and the elements to be controlled thereby.

9 Claims, 5 Drawing Sheets

CONTROL REGISTER ASSEMBLY

BACKGROUND OF THE INVENTION

Field of the Invention

The present invention relates to control registers for controlling components in an electric circuit.

If an electric circuit is a microcontroller, a control register controls, in particular, the peripheral units of the microcontroller, more precisely switches, multiplexers, or other controllable elements contained therein. The control registers are normally a constituent part of the peripheral units to be controlled. The CPU writes to the control register via a bus that connects the peripheral units and the CPU of the microcontroller to each other. A fixed allocation controls which elements of the peripheral units are controlled by which particular control register elements. The control register elements and the elements to be controlled thereby are connected to each other via electric lines so that the elements to be controlled are stored directly by data stored in the control register.

The aforementioned connections between the control register elements and the elements to be controlled, and also the connections between the control register elements and the device writing these can occasionally constitute a problem.

One example in which this can be the case is illustrated in FIGS. 1 and 2.

FIG. 1 shows a cross bar switch, as it is known, via which data output from data sources designated in FIG. 1 by GTCG0 to GTCG3 and LTCG0 to LTCG7 is transferred to data sinks designated in FIG. 1 by PG0 to PG6. It is possible to set, by using the switch networks (multiplexers) designated by OMG00 to OMG26 in FIG. 1, which data are transferred where.

The construction of one of the switch networks OMG00 to OMG26 is illustrated in FIG. 2.

As can be seen from FIG. 2, the switch network shown has a total of 64 switches. These switches preferably are controlled by control registers, for example by two 32-bit control registers.

In the configuration shown in FIG. 1, 21 switch networks of the type of FIG. 2 are contained, so that a total of 42 32-bit registers are needed to control these switch networks. In order to connect these control registers to the CPU and to the elements to be controlled, a total of several thousand connection lines are required, which can assume a considerable length. The expenditure on wiring and the chip area therefore assume a size that is no longer acceptable, particularly because the configuration shown in FIG. 1 is already covered by a dense line network, without the aforementioned connecting lines. One remedy that could be provided would be not to drive the individual switches independently of one another, but to control more or less large switch groups in the same way. In this way, the expenditure on wiring could be reduced somewhat. On the other hand, it would require tolerating the fact that the configuration according to FIG. 1 could no longer be used so flexibly. Furthermore, an expenditure on wiring would certainly be lower but would still exceed limits.

SUMMARY OF THE INVENTION

It is accordingly an object of the invention to provide a control register assembly that overcomes the above-mentioned disadvantages of the heretofore-known devices of this general type and that controls components to be controlled in an electric circuit by using control registers that may be implemented with less expenditure than has hitherto been the case.

With the foregoing and other objects in view there is provided, in accordance with the invention, a control register assembly for controlling components. The control register assembly includes a control register formed from a shift register. The shift register has elements distributed over an electric circuit at mutual intervals. The electric circuit holds the components to be controlled.

In accordance with a further object of the invention, the elements are distributed individually over the electric circuit. Alternatively, the elements can be distributed in groups over the electric circuit. Preferably, the elements or groups of elements are disposed in vicinities of the components.

In accordance with a further object of the invention, the control register assembly includes a data input register formed from a shift register and has a shift cycle rate and data written in parallel therein. The control register is supplied the data from the data input register sequentially and subsequently shifts the data onward internally.

In accordance with a further object of the invention, each shift register of the control register is assigned a respective data input register.

In accordance with a further object of the invention, the control register assembly includes a data output register formed from a shift register. The control register has a shift cycle rate and shifts data therefrom to the data output register at the shift cycle rate. The data output register accepts the data from the control register at the shift cycle rate, shifts subsequently the data internally, and outputs the data in parallel.

In accordance with a further object of the invention, each shift register of the control register is assigned a respective data output register.

In accordance with a further object of the invention, the shift registers are operable independently.

The control register according to the invention is distinguished by the fact that it is formed by at least one shift register. The elements of the shift register are distributed over the electric circuit at mutual intervals, individually or in groups.

As a result, only one or a few control register elements (one control register element per shift register) must be connected to the device that writes the control register (as opposed to each of the control registers). The control register elements can be constructed in the immediate vicinity of the elements to be controlled by them.

This has the positive effect that the length of the connecting lines between the control register elements and the device writing the latter, and the length of the connecting lines between the control register elements and the elements to be controlled by them may be shortened considerably.

Other features which are considered as characteristic for the invention are set forth in the appended claims.

Although the invention is illustrated and described herein as embodied in a control register assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
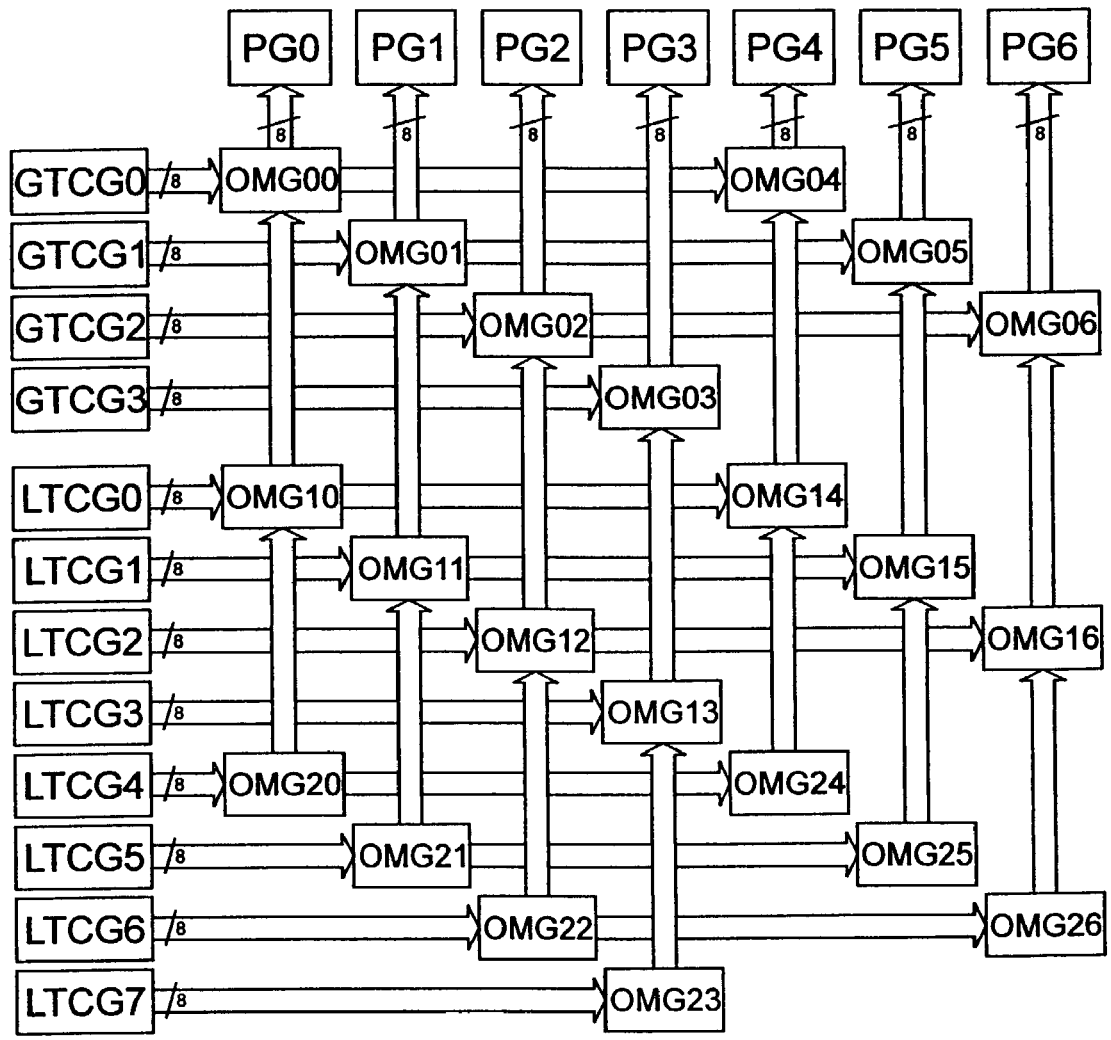
FIG. 1 is a block diagram of a prior-art configuration in which the control register assembly according to the invention can be applied.
Figure 2:
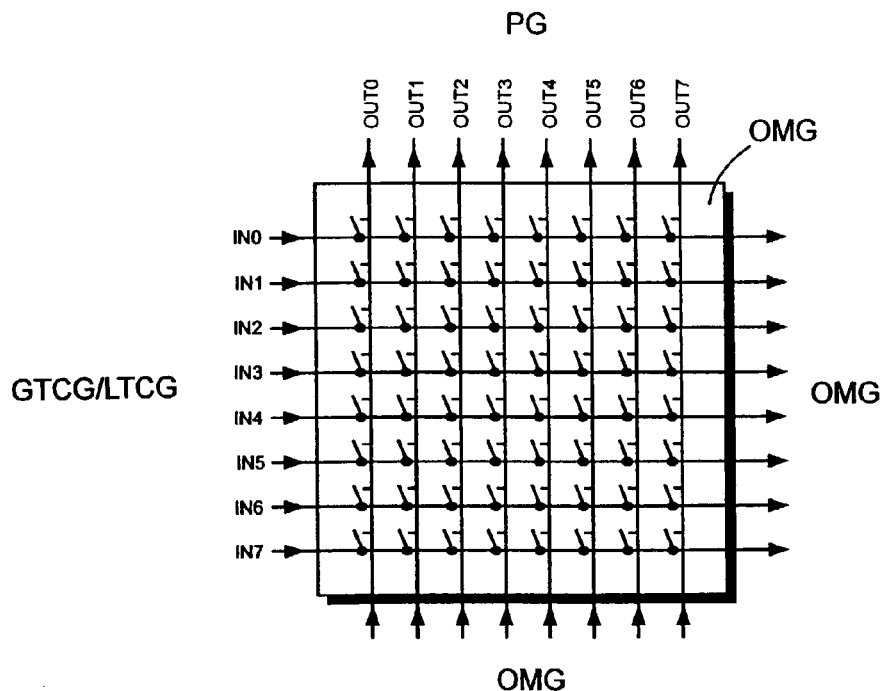
FIG. 2 is a block diagram of a prior-art switch network used in the configuration according to FIG. 1.

Referring now to the figures of the drawing in detail, there is seen a control register that is a constituent part of a microcontroller, more precisely of a peripheral unit of the same, for example, of a cross bar switch shown in FIG. 1 of an I/O interface, of an A/D converter, of a DMA controller, of a CAN controller, of a timer, or any other desired peripheral unit.

However, it should be noted that the control register can also be used in other program-controlled units such as microprocessors, signal processors, etc., and in any other desired electric circuits.

In the example considered, the control register is written by the CPU of the microcontroller. However, it could also be written by another peripheral unit or a device provided outside the microcontroller.

The control register considered in the present case is distinguished by the fact that it is formed by at least one shift register, whose elements are distributed over the electric circuit at mutual intervals, individually or in groups.

Figure 3:
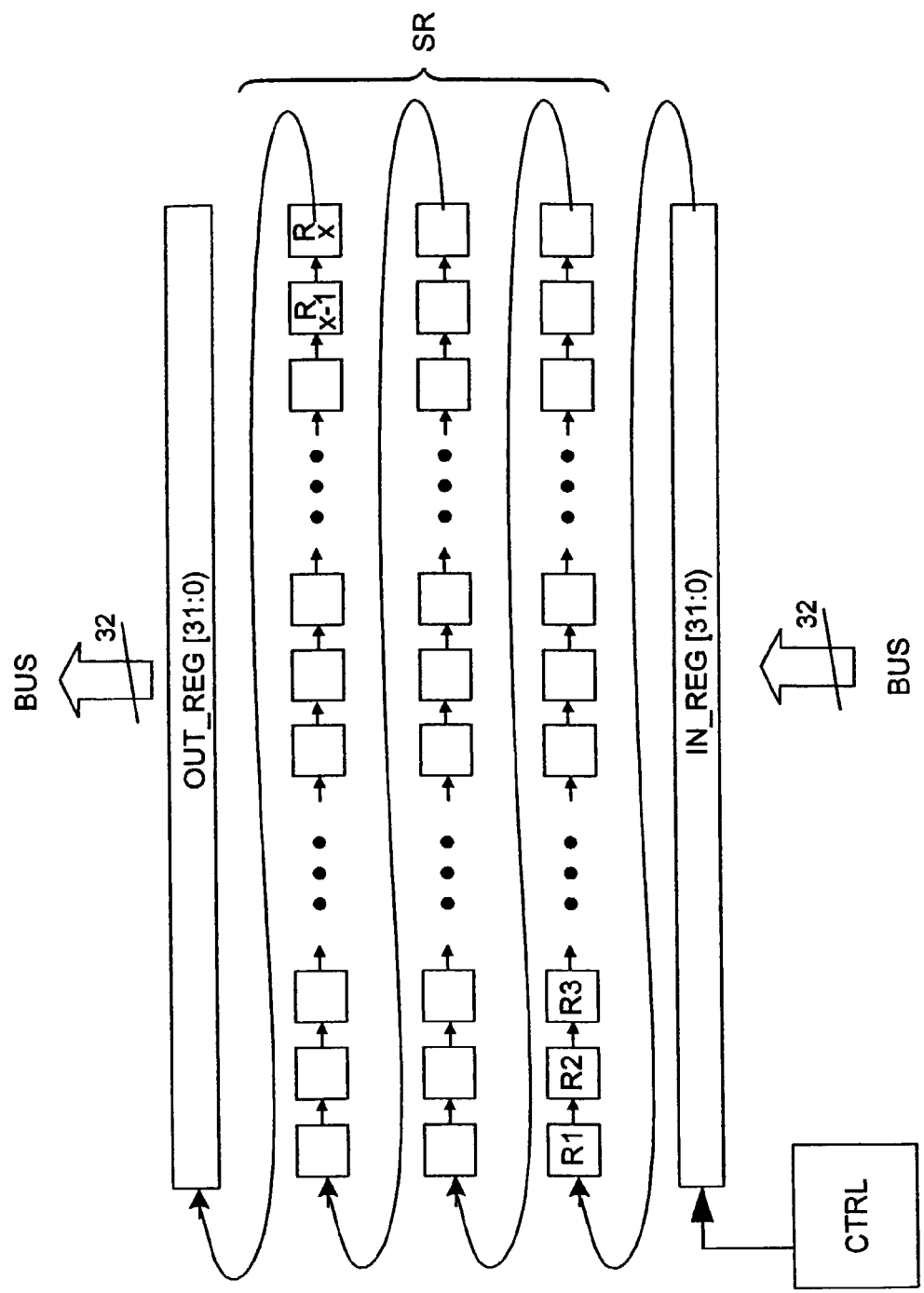
FIG. 3 is a block diagram of a first exemplary embodiment of the control register assembly according to the invention.

A first exemplary embodiment of such a control register is illustrated in FIG. 3. The configuration shown in FIG. 3 includes a data input register IN_REG, a data output register OUT_REG, a control register SR disposed between them, and a control device CTRL. The data input register IN_REG is formed by a shift register whose elements can be written in parallel and which outputs stored data sequentially by carrying out a shift operation. The data output register OUT_REG is formed by a shift register that accepts data supplied to it sequentially and shifts it onward internally and whose elements can be read out in parallel. The control register SR is formed by a shift register that accepts the data shifted from the data input register IN_REG at the shift cycle rate that is common to all the shift registers and is generated by the control device CTRL and shifts the data onward internally, and, associated therewith, shifts data stored in the control register SR onward to the data output register OUT_REG at the common shift cycle rate. The individual elements R1 to Rx of the control register SR not being distributed immediately adjacent to one another, as in the case of normal shift registers and in the case of normal shift registers, but being distributed at more or less large mutual intervals over the peripheral unit, whose constituent part is the configuration shown in FIG. 3. The control register elements R1 to Rx preferably in each case are disposed in the vicinity of the elements that are to be controlled by the data stored in the respective control register elements.

As has already been explained above, the control register SR is written by the CPU of the microcontroller. However, writing the control register SR is carried out on the diversionary route via the data input register IN_REG. More precisely, the data to be written into the control register SR by the CPU is first written into the data input register IN_REG via a bus BUS.

In the example considered, the bus BUS and the data input register IN_REG are in each case 32 bits wide, and the data transferred over the bus BUS is written in parallel into the data input register IN_REG. For completeness, it should be pointed out that the width of the data input register IN_REG and the width of the bus BUS can be of any desired size, independently of each other.

The data written into the data input register IN_REG is then shifted sequentially out of the data input register IN_REG at the cycle rate of a shift clock generated by the control device CTRL and is supplied to the control register SR.

The control register SR accepts the data supplied to it and shifts it onward internally from control register element to control register element. The cycle rate at which this is done is the shift cycle rate generated by the control device CTRL and used by the data input register IN_REG.

The shifting operation is carried out until the data has been shifted onward to the control register elements for which it is intended. The control device CTRL takes care that this is ensured.

The control register elements R1 to Rx are connected, via lines not shown in FIG. 1, to the elements to be controlled by them, more precisely to the switches, multiplexers etc. to be controlled by them. Therefore, the control register elements control the elements to be controlled by them as is the case in a conventional control register.

During the action of shifting the data stored in the data input register IN_REG into the control register SR, the data stored in the control register SR is shifted sequentially out of the latter and supplied to the data output register OUT_REG. The data output register OUT_REG accepts the data supplied to it and shifts it onward internally from data output register element to data output register element. The cycle rate at which this is done is the shift cycle rate generated by the control device CTRL and used by the data input register IN_REG and by the control register SR.

The data stored in the data output register OUT_REG can be read out in parallel by the CPU via the bus BUS.

The data output register OUT_REG is not required to control the elements to be controlled by the control register SR, and could also be omitted. However, during the testing of the configuration, the provision of the data output register OUT_REG, its writing by the control register SR and its reading by the CPU provide the following advantage. Comparing the data written into the data input register IN_REG with the data read out from the data output register OUT_REG following a specific number of shift cycles permits proper operation of all the control register elements to be detected.

The number of elements R1 to Rx of the control register SR can be as large as desired. In particular, it can also be lesser or greater than the number of elements of the data input register IN_REG and/or the number of elements of the data output register OUT_REG and/or the width of the bus BUS.

As has already been described above, the written control register controls the elements to be controlled by it in the same way as a conventional control register.

As a result of the fact that the control register is formed by a shift register whose elements are distributed over the electric circuit at mutual intervals, the length of the connecting lines from and to the control register elements may be reduced considerably.

There are two reasons for this. The first reason is that not every control register element has to be connected via its own connecting line to the device that writes the control register. It is sufficient for one of the control register elements to be connected to the device that writes the control register, and for the remaining control register elements to be connected to one another, forming a control register element chain. The second reason for shortening the length of the connecting lines is that the control register elements can be disposed independently of one another at any desired location within the peripheral unit containing these. Accordingly, in each case, they can be disposed in the immediate vicinity of the elements to be controlled by them. Consequently, in each case, only very short connection lines are required to connect the control register elements to the elements to be controlled by them.

Figure 4:
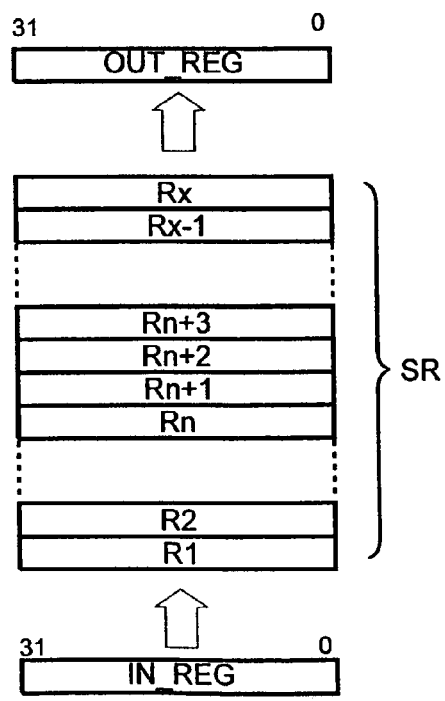
FIG. 4 is a block diagram showing the construction of the control register assembly shown in FIG. 3.

For the user, the control register of the configuration shown in FIG. 3 appears like a FIFO shown in FIG. 4.

The configuration shown in FIG. 3 may be modified in various ways. Two examples of this are shown in FIGS. 5 and 6.

Figure 5:
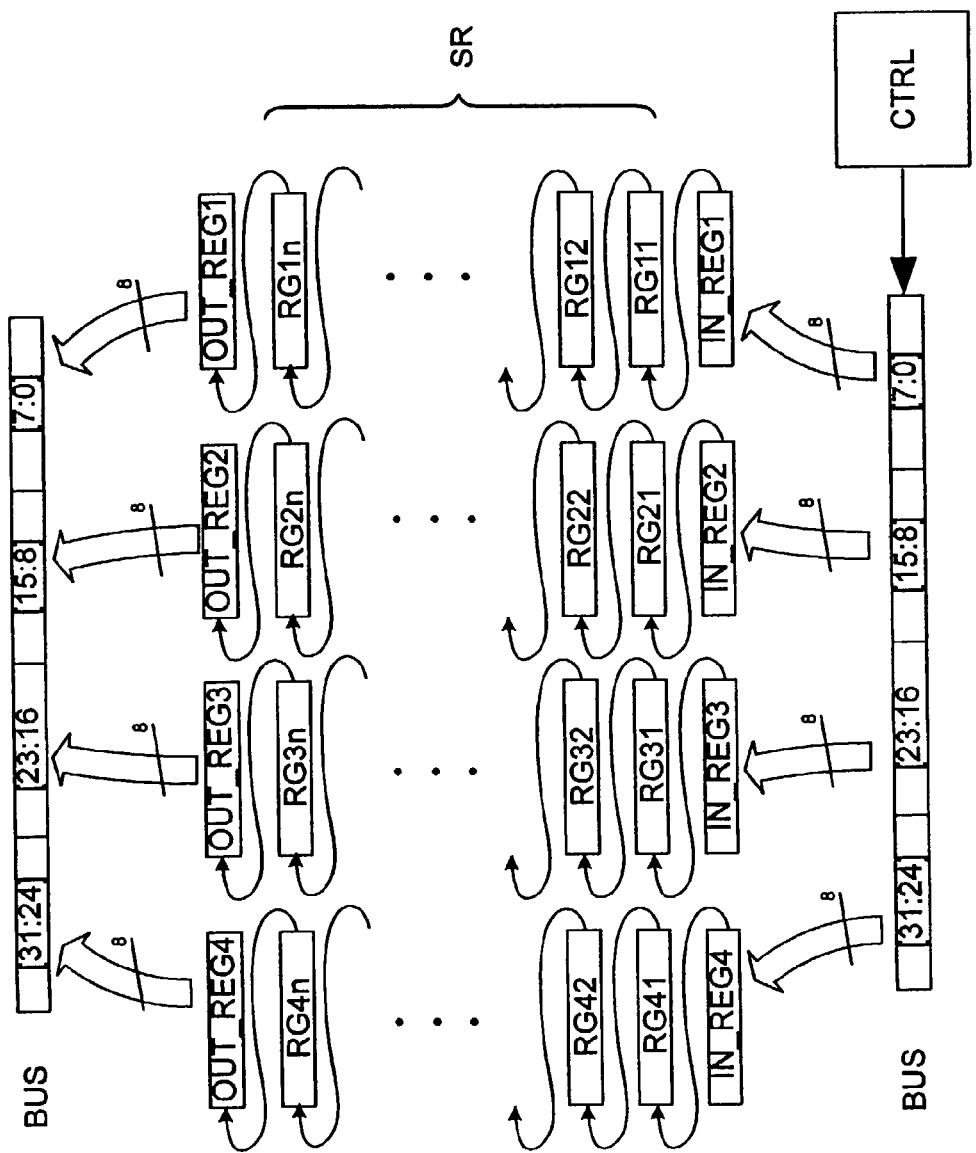
FIG. 5 is a block diagram of a second exemplary embodiment of the control register assembly according to the invention.
Figure 6:
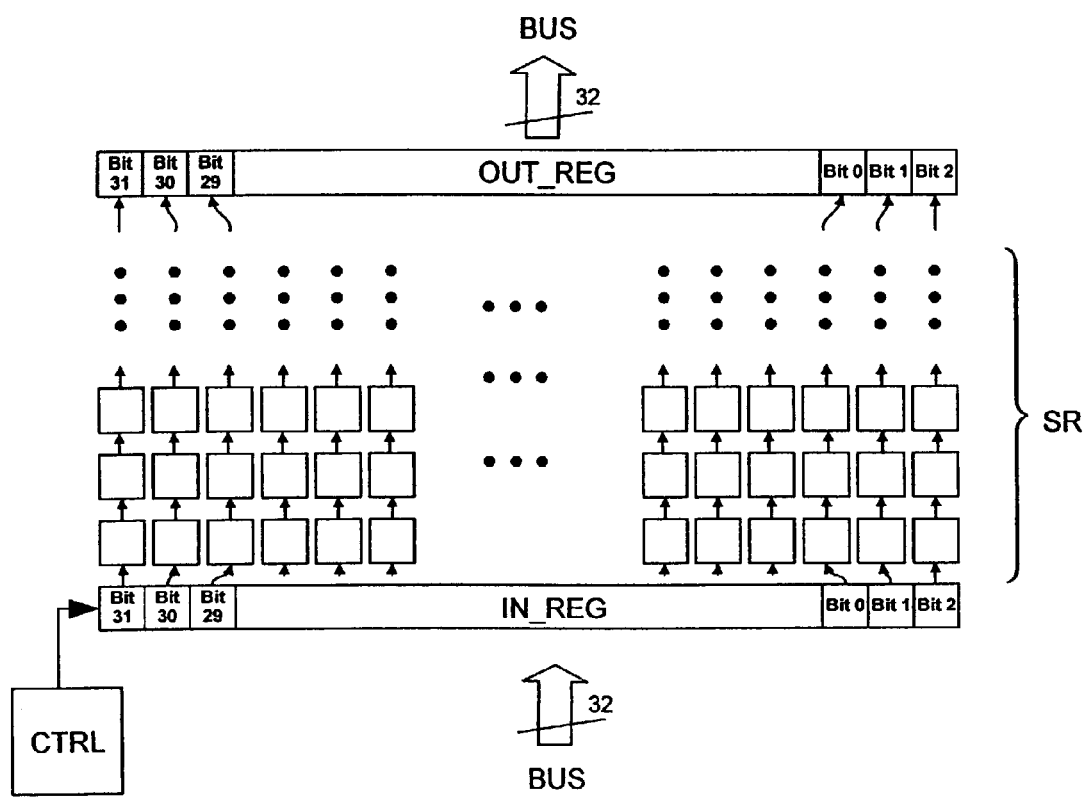
FIG. 6 is a block diagram of a third exemplary embodiment of the control register assembly described below.

In the configuration shown in FIG. 5, instead of a single data input register IN_REG, four data input registers IN_REG1 to IN_REG4 are provided. Instead of a single data output register OUT_REG, four data output registers OUT_REG1 to OUT_REG4 are provided. The control register SR includes four shift registers S1 to S4 that are not connected to one another and therefore can in principle be operated independently of one another, these shift registers in each case being disposed between one of the data input registers IN_REG1 to IN_REG4 and a data output register associated with the relevant data input register. The control register elements are in each case subdivided into control register element groups RG11 to RG4n forming a plurality of control register elements (8 in each case in the example considered). The control register element groups in each case form a coherent unit, but the individual control register element groups being distributed independently of one another at mutual intervals over the peripheral unit containing the configuration according to FIG. 5.

Of the plurality of data input registers IN_REG1 to IN_REG4, each contains only a specific fraction of the elements (in each case one quarter in the example considered) of the individual data input register IN_REG according to FIG. 3, but the sum of the elements of all the data input registers covers IN_REG1 to IN_REG4 corresponds to the number of register elements of the single data input register IN_REG according to FIG. 3. The various data input registers IN_REG1 to IN_REG4 are shift registers that can be operated independently of one another in each case.

This is correspondingly true of the data output registers OUT_REG1 to OUT_REG4.

The control register SR is written via the data input registers IN_REG1 to IN_REG4. More precisely, the data to be written into the control register SR by the CPU is firstly written into the data input registers IN_REG1 to IN_REG4 via the bus BUS.

The bus BUS is again 32 bits wide here, and the data input registers IN_REG1 to IN_REG4 are in each case eight bits wide. The data input registers IN_REG1 to IN_REG4 are written in parallel at the same time. For completeness, it should be pointed out that the data input registers IN_REG1 to IN_REG4 and the bus BUS can have any other desired sizes. In this case, it is not necessary for all the data input registers to be of equal size.

The data written into the data input register IN_REG1 is then shifted sequentially out of the data input register IN_REG1 at the cycle rate of a shift clock generated by the control device CTRL and supplied to the first shift register S1 extending between the data input register IN_REG1 and the data output register OUT_REG1 and belonging to the control register SR.

The first shift register S1 accepts the data supplied to it and shifts it onward internally from control register element to control register element. The cycle rate at which this is done is the shift cycle rate generated by the control device CTRL and used by the data input register IN_REG1.

The shifting operation is carried out until the data has been shifted onward to the control register elements for which it is determined. The control device CTR ensures that this is the case. In this connection, it should be noted that the many shift registers S1 to S4 of the control register can have as many control register elements as desired, independently of one another.

When data stored in the data input register IN_REG1 is being shifted into the first shift register S1, the data stored in the first shift register is shifted sequentially out of the latter and supplied to the data output register OUT_REG1. The data output register OUT_REG1 accepts the data supplied to it and shifts it onward internally from data output register element to data output register element. The cycle rate at which this is done is the shift cycle rate generated by the control device CTRL and used by the data input register IN_REG1 and by the first shift register.

Exactly the same operations take place when writing to the second shift register S2 provided between the second data input register IN_REG2 and the second data output register OUT_REG2 associated therewith. They also occur when writing to the third shift register S3 provided between the third data input register IN_REG3 and the third data output register OUT_REG3 associated therewith. Likewise, they occur when writing to the fourth shift register S4 provided between the fourth data input register IN_REG4 and the fourth data output register OUT_REG4 associated therewith. It is possible in each case for one, more than one or all the shift registers to be written at the same time.

The data stored in the data output registers OUT_REG1 to OUT_REG4 can be read out in parallel at the same time by the CPU via the bus BUS and can be used to test the control register.

The differences in structure present between the configuration shown in FIG. 5 and the configuration shown in FIG. 3 primarily have an effect on the act of writing to the control register, described above. The actual function of the control register is not affected by this. This means that the control of the elements to be controlled is carried out by the control register, as in the configuration shown in FIG. 3 and described with reference thereto.

The configuration shown in FIG. 5 also has the advantages of the configuration shown in FIG. 3. This means that it may be implemented in practical terms with a relatively low expenditure on wiring.

The configuration shown in FIG. 5 has two advantages as compared with the configuration shown in FIG. 3: it is possible to write to a larger number of control register elements per unit time, and it is possible to write to only specific parts of the control register elements (only a single shift register or a specific plurality of shift registers of the control register).

It should be clear that the control register could contain more or fewer than four shift registers. One example, in which the control register contains 32 shift registers, is shown in FIG. 6.

The configuration shown in FIG. 6 can be understood together with the explanations given in relation to FIG. 5, without a description going into detail.

Finally, it should be pointed out that the number of control register elements that are included in the control register element groups of the configuration according to FIG. 5 is independent of the number and size of the data input registers and data output registers. In addition, the control register can have any desired number of control register element groups, it being possible for each control register element group to be of any desired size, irrespective of the size of all the other control register element groups. The configurations according to FIGS. 3 and FIG. 6, control register element groups forming a plurality of control register elements, can also be provided.

The control register described makes it possible, irrespective of the details of the practical implementation, to keep short the length of the connecting lines between the control register and the device writing to the latter and between the control register and the elements to be controlled thereby.

We claim:

1. A control register assembly for controlling components, comprising:
    a control register being a shift register having elements disposed at spaced intervals over an electric circuit, said electric circuit including said components to be controlled, said spaced intervals of said elements causing said elements to be constructed in the immediate vicinities of said components for shortening a length of connecting lines between said control register and said components.

2. The control register assembly according to claim 1, wherein said elements are distributed individually over said electric circuit.

3. The control register assembly according to claim 1, wherein said elements are distributed in groups over said electric circuit.

4. The control register assembly according to claim 3, wherein said groups of said elements are disposed in vicinities of the components.

5. The control register assembly according to claim 1, further comprising:
    a data input register formed from a shift register and having a shift cycle rate and data written in parallel therein;
    said control register being supplied the data from said data input register sequentially and subsequently shifting the data onward internally.

6. The control register assembly according to claim 5, wherein said control register includes a plurality of shift registers and each of said shift registers of said control register is assigned a respective data input register.

7. The control register assembly according to claim 1, further comprising:
    a data output register formed from a shift register;
    said control register having a shift cycle rate and shifting data therefrom to said data output register at the shift cycle rate;
    said data output register accepting the data from said control register at the shift cycle rate, shifting subsequently the data internally, and outputting the data in parallel.

8. The control register assembly as claimed in claim 7, wherein said control register includes a plurality of shift registers and each of said shift registers of said control register is assigned a respective data output register.

9. The control register assembly according to claim 1, wherein said control register includes a plurality of shift registers and said shift registers are operable independently.

* * * * *